(12) United States Patent  
Gupta et al.

(10) Patent No.: US 8,438,432 B2
(45) Date of Patent: May 7, 2013

(54) DRAM MEMORY CONTROLLER WITH BUILT-IN SELF TEST AND METHODS FOR USE THEREWITH

(75) Inventors: Rajat Gupta, Mississauga (CA); Chun-Chin Yeh, Markham (CA)

(73) Assignee: ViXS Systems, Inc., Toronto, Ontario (CA)

( * ) Notice: Subject to any disclaimer, the term of this patent is extended or adjusted under 35 U.S.C. 154(b) by 498 days.

(21) Appl. No.: 12/868,648

(22) Filed: Aug. 25, 2010

(65) Prior Publication Data

US 2012/0054566 A1 Mar. 1, 2012

(51) Int. Cl.
*G01R 31/3181* (2006.01)

(52) U.S. Cl.
USPC .......................................... 714/718; 714/733

(58) Field of Classification Search .................. 714/718, 714/733
See application file for complete search history.

(56) References Cited

U.S. PATENT DOCUMENTS

| | | | | |
|---|---|---|---|---|
| 4,827,476 A | * | 5/1989 | Garcia | 714/728 |
| 4,980,888 A | * | 12/1990 | Bruce et al. | 714/718 |
| 5,825,784 A | * | 10/1998 | Spaderna et al. | 714/724 |
| 5,961,653 A | * | 10/1999 | Kalter et al. | 714/6.32 |
| 6,182,254 B1 | * | 1/2001 | Bae | 714/718 |
| 6,272,588 B1 | * | 8/2001 | Johnston et al. | 711/106 |
| 6,421,286 B1 | * | 7/2002 | Ohtani et al. | 365/200 |
| 6,523,135 B1 | * | 2/2003 | Nakamura | 714/30 |
| 7,356,741 B2 | * | 4/2008 | Boehler | 714/718 |
| 2004/0123192 A1 | | 6/2004 | Caty et al. | |
| 2010/0174955 A1 | | 7/2010 | Carnevale et al. | |

OTHER PUBLICATIONS

European Search Report, EP Application No. 11 17 7820, Dec. 7, 2011, 5 pages.

* cited by examiner

*Primary Examiner* — Stephen M Baker

(74) *Attorney, Agent, or Firm* — Garlick & Markison; Bruce E. Stuckman

(57) ABSTRACT

An integrated circuit is interfaced with at least one dynamic random access memory (DRAM) via a memory interface. A plurality of user test options are received. The testing of the memory interface is controlled in accordance with the plurality of user test options. Test data, generated as a result of the testing of the memory interface, is stored.

18 Claims, 8 Drawing Sheets

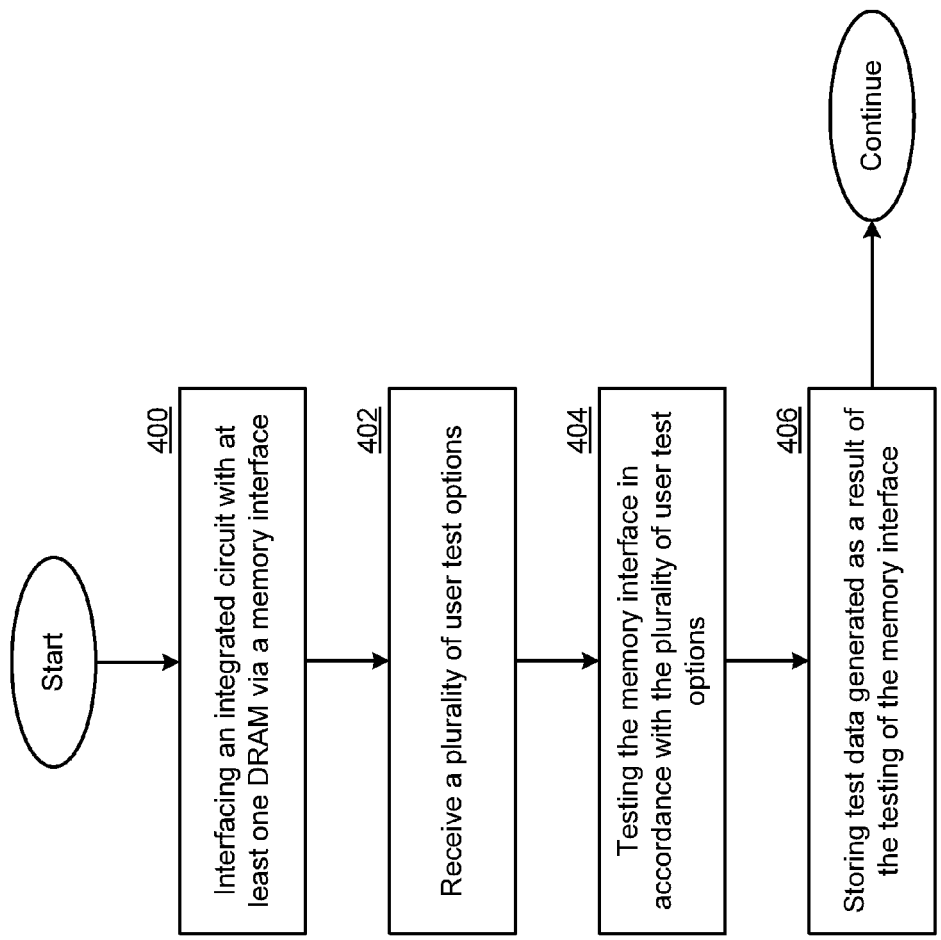

DRAM MEMORY CONTROLLER WITH BUILT-IN SELF TEST AND METHODS FOR USE THEREWITH

CROSS REFERENCE TO RELATED PATENTS

NOT APPLICABLE

TECHNICAL FIELD OF THE INVENTION

The present invention relates to security in processing devices.

DESCRIPTION OF RELATED ART

The use of on-board dynamic random access memory (DRAM) is ubiquitous in consumer electronics based on integrated circuits (ICs), such as systems on a chip (SoCs). Many ICs or the SoCs interface with the DRAM using a massively parallel high-speed interface of over 75 interconnects, all of which have to meet a very tight timing budget. The timing budget gets progressively tighter with every generation of DRAM. Currently with Dual Data Rate 3 (DDR3) version of DRAM, timing margins can be as small as only a few picoseconds or smaller. ICs and SoCs can rely heavily on the stability of its interface with DRAM. Any failures on this interface effectively renders the final product useless. The burden of testing this challenging interface is shared by the IC/SoC designer, printed circuit board (PCB) designer and the original equipment manufacturer (OEM) who integrates all the components into the final product.

A video/graphics software application can be used to perform the testing. Software engineers typically rely on stable hardware to stress test and debug their application. But when the hardware is unstable, it becomes very difficult to distinguish between hardware and software failures. This makes the debugging process difficult for both sides. Even if the software application is assumed to fully stable (bug free), it can not provide any meaningful hardware debug information in the event of a failure. This is because the application detects and reports the failure much after the actual hardware failure and so the configuration of the failing system is not preserved. Since the software application involves interaction of multiple hardware engines (video, graphics, processors running simultaneously), it is generally very difficult to reproduce the exact failure. This is because the events causing failure may line-up differently in successive iteration. In summary, it is very difficult and sometimes impossible to root-cause hardware failures due to SoC-DRAM subsystem using a complex software application.

In other systems a host (CPU) which is internal or external to the SoC can coordinate the testing. The host along with the DMA engine writes data to the frame buffer and subsequently reads it back and performs the comparison. This technique provides good control to the user over the type of tests and also provides debug data in the event of a failure. But it may not provide adequate testing of the interface. The host can execute only a limited number of posted read transactions. This leads to idle cycles on the interface, which greatly reduces the effectiveness of the test. Alternatively the host can perform large write and read burst using DMA engine to increase the bandwidth (reduce idle cycles). This does not provide adequate testing because individual read and write transactions are not interleaved.

Further limitations and disadvantages of conventional and traditional approaches will become apparent to one of ordinary skill in the art through comparison of such systems with the present invention.

BRIEF DESCRIPTION OF THE SEVERAL VIEWS OF THE DRAWINGS

FIG. 10 presents a flowchart representation of a method in accordance with an embodiment of the present invention.

DETAILED DESCRIPTION OF THE INVENTION INCLUDING THE PRESENTLY PREFERRED EMBODIMENTS

Figure 1:
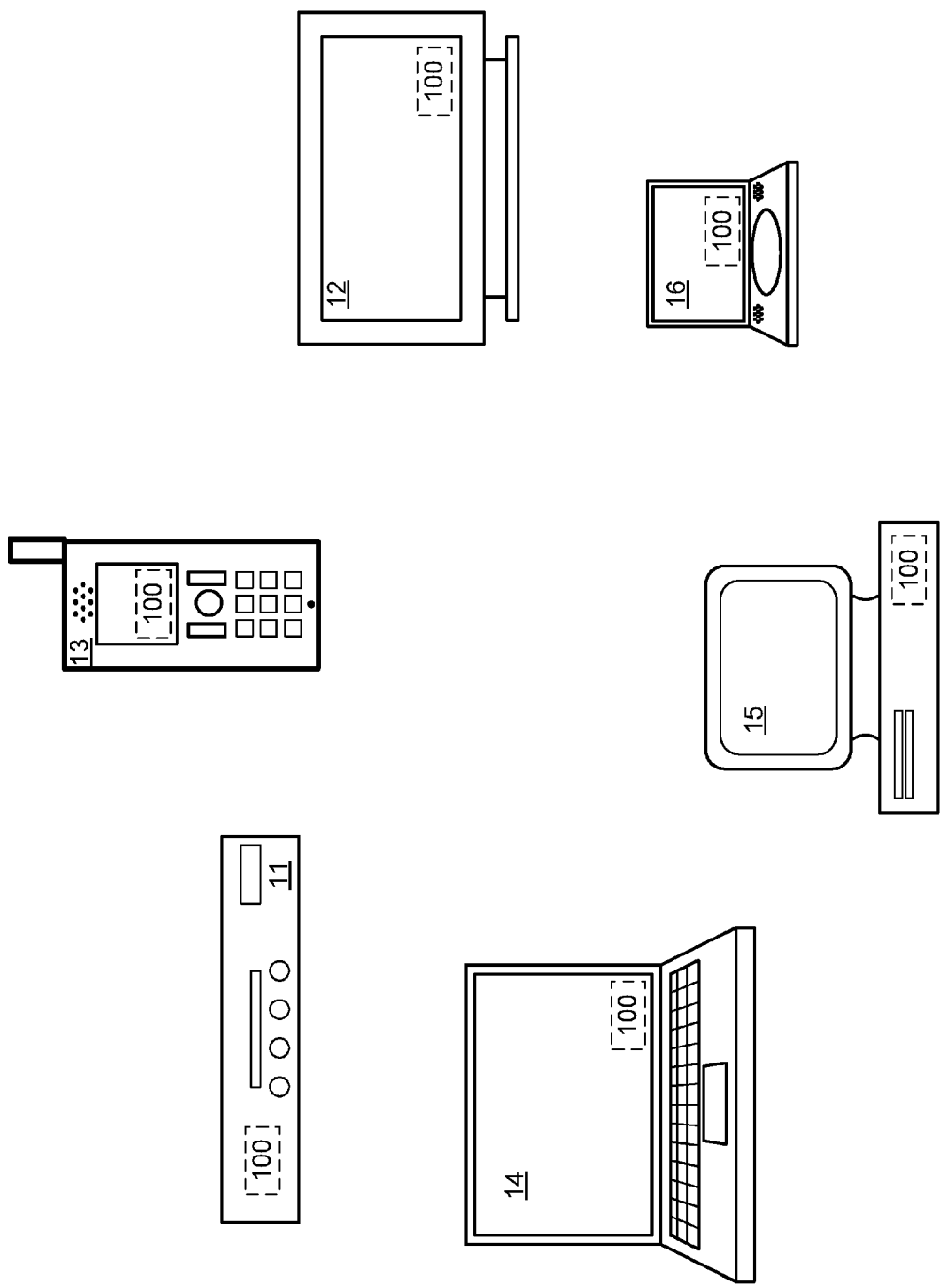
FIG. 1 presents a pictorial representation of example devices 11-16 that can include a processing system 100 in accordance with an embodiment of the present invention.

FIG. 1 presents a pictorial representation of example devices 11-16 that can include a processing system 100 in accordance with an embodiment of the present invention. In particular, these example devices include digital video recorder/set top box 11, television or monitor 12, wireless telephony device 13, computers 14 and 15, personal video player 16, or other devices that include a processing system 100.

Processing system 100 includes a processing module that operates in conjunction with one or more DRAM devices, a DRAM controller and a memory interface. In addition, the processing system includes a flexible built-in self test (DBIST) unit that includes a input register for receiving a plurality of user test options, a controller for controlling the testing of the memory interface in accordance with the plurality of user test options and an output register, coupled to the controller, for storing test data generated as a result of the testing of the memory interface. Processing system 100 will be described in greater detail in conjunction with FIGS. 2-10, including several optional functions and features.

While processing module 100 is shown as being integrated in each of the devices 11-16, in an alternative embodiment of the present invention, processing module 100 can be coupled to one or more of these host devices via a host interface. In particular, processing module 100 can take on any one of a number of form factors such as a PC card, memory card, personal computer memory card international association (PCMCIA) card, universal serial bus (USB) dongle or other device that is coupleable to one or more host devices via an Ethernet connection, a memory card interface, USB connection, Firewire (IEEE 1394) connection, small computer system interface (SCSI), PCMCIA interface, or other interface either standard or proprietary or that is incorporated into the device 11-16.

Figure 2:
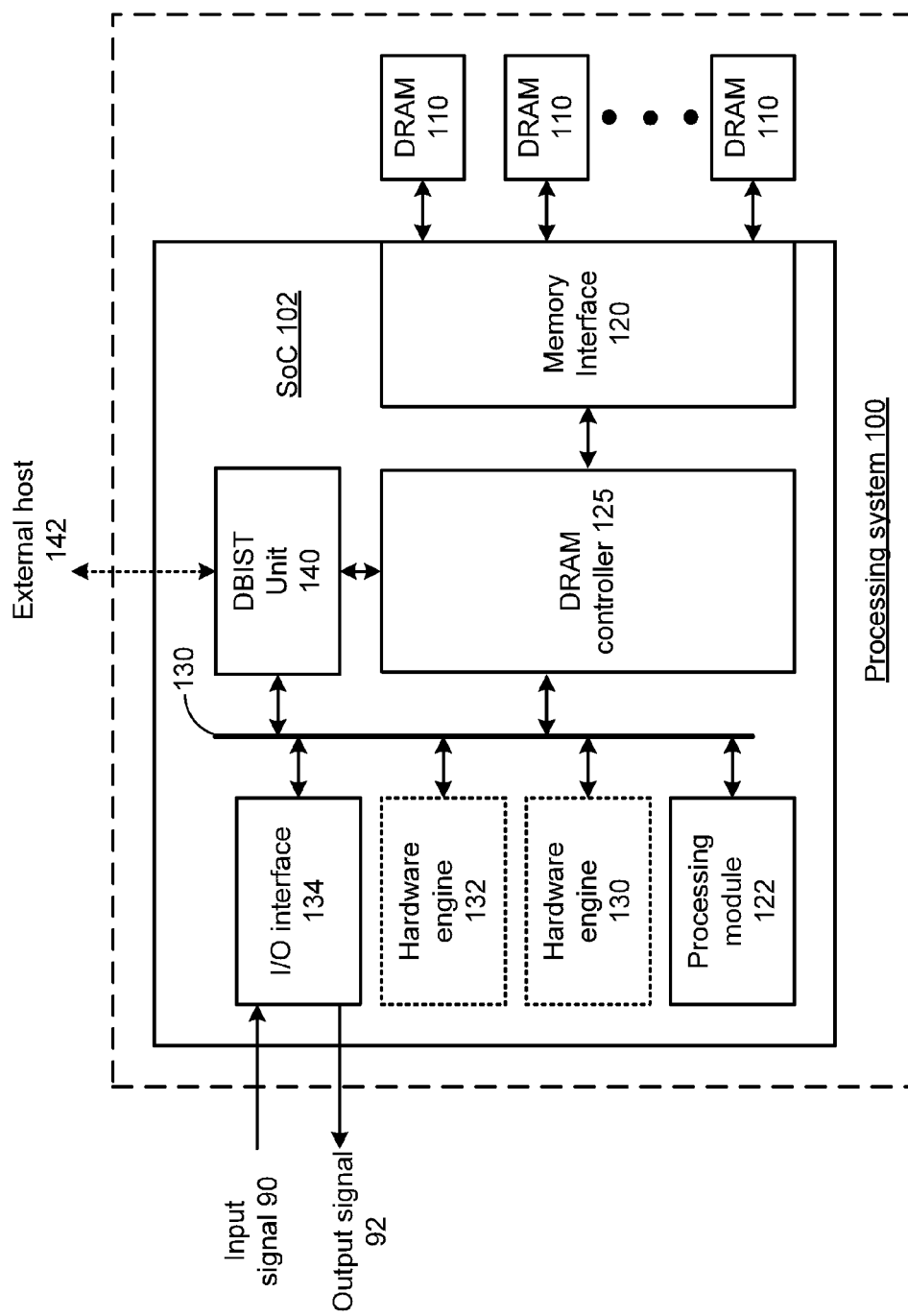
FIG. 2 presents a block diagram representation of a processing system 100 in accordance with an embodiment of the present invention.

FIG. 2 presents a block diagram representation of a processing system 100 in accordance with an embodiment of the present invention. In particular, a processing system 100 is shown that includes DRAM controller 125 and a memory interface 120 for interfacing an SoC 102 with one or more DRAM chips 110. Processing module 122 executes one or more software programs such as applications, operating systems, utilities or other programs in conjunction with optional hardware engines 130 and 132. In part, the processing system 100 receives at least one input signal 90 and produces at least one output signal 92 via I/O interface 134 in conjunction with a wired or wireless device interface, one or more input output devices or one or more other peripheral devices coupled to the processing system 100.

The processing module 122 and hardware engines 130 and 132 can each be implemented using a single processing device or a plurality of processing devices. Such a processing device may be a microprocessor, co-processors, a microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions that are stored in a memory, such as the DRAMs 110 or internal memory to each device. In particular, when the processing module 122 or hardware engines 130 and 132 implement one or more of its functions via a state machine, digital circuitry, and/or logic circuitry, the memory storing the corresponding operational instructions may be embedded within the circuitry comprising the state machine, analog circuitry, digital circuitry, and/or logic circuitry. While a particular bus architecture is shown, alternative architectures using direct connectivity between one or more modules and/or additional buses can likewise be implemented in accordance with the present invention. While processing system 100 is shown in conjunction with a SoC 102, other integrated circuit configurations are likewise possible.

The memory interface 120 can include a physical layer (PHY), high speed IOs, package substrate, and the PCB traces that provide high speed bidirectional communication between the DRAM2 110 and DRAM controller 125. In particular, the memory interface can provide a high-speed parallel interface running at 800 MHz, though higher or lower frequencies can likewise be employed. In many circumstances, the memory interface can be sensitive to cross-coupling, power and ground switching noise, variations in voltage and temperature, electromagnetic interference (EMI) from other PCB components, etc. In addition, the lengths of interconnects between the DRAMs 110 and the memory interface 120 may need to be precisely balanced.

As discussed in conjunction with FIG. 1, a DBIST unit 140 is included for testing the memory interface 120. Unlike a common BIST unit used in the context of testing on-die static random access memories (SRAMs) already existing in the proximity, DBIST 140 tests the memory interface 120 to one or more off-chip DRAM devices 110. In particular, DBIST 140 operates in conjunction with either an internal host, such as processing module 122 or an external host 142 to initiate testing of the memory interface 120 and to analyze the test results received as a result of the tests.

Further details pertaining to the operation of DBIST 140, including several optional functions and features will be described in conjunction with FIGS. 3 and 10 that follow.

Figure 3:
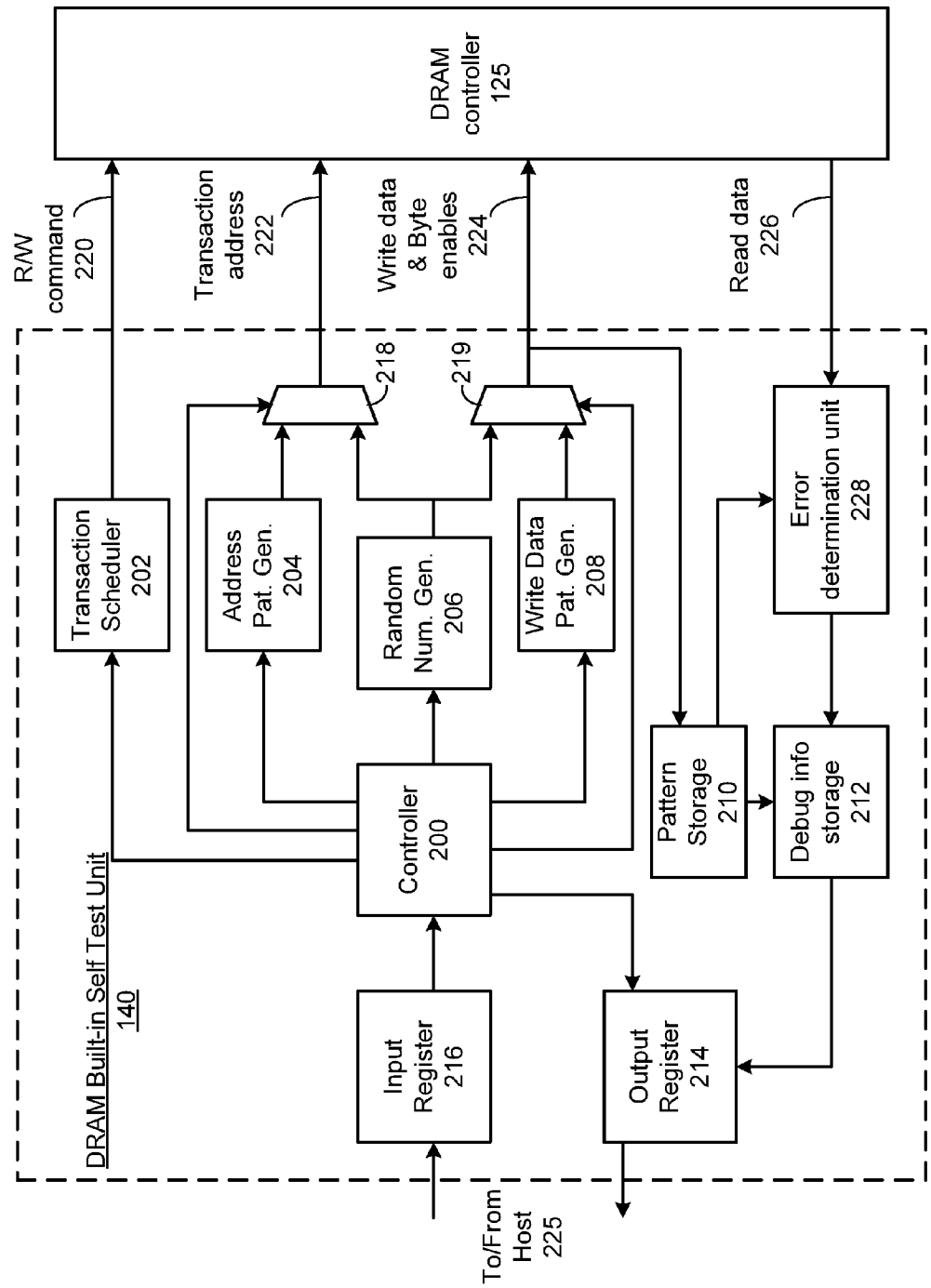
FIG. 3 presents a block diagram representation of a built-in self test unit 140 in accordance with an embodiment of the present invention.

FIG. 3 presents a block diagram representation of a built-in self test unit 140 in accordance with an embodiment of the present invention. In particular, DBIST 140 includes an input register 216 for receiving and storing a plurality of user test options from a host 225, such as an internal host of processing system 100 or an external host 142 such as an external personal computer (PC) or other host device. A controller 200, such as a state machine or other processing device controls the testing of the memory interface 120 in accordance with the user test options. An output register 214 stores test data generated as a result of the testing of the memory interface 120 for retrieval and analysis by the host 225. In addition, DBIST unit 140 includes transaction scheduler 202, pattern address generator 204, random number generator 206, write data pattern generator 208, pattern storage 210, debug information storage 212, selectors 218 and 219 and error determination unit 228. In an embodiment of the present invention, on-chip SRAMs are used in the implementation of the Pattern Storage 210 and Debug Information Storage 212. A substantial area savings can be achieved by chaining together several large SRAMs in the proximity of DC-DBIST Engine.

In operation, the DBIST 140 issues read and write commands 220, transaction addresses 222, and when applicable, write data and byte enables 224 to DRAM controller 125. In response, DBIST self test unit 140 receives read data 226 from DRAM controller 125 that can be compared to the data that was written in error determination unit 228 to identify errors. In response the conditions causing the error can be stored in output register 214 for analysis.

DBIST 140 allows a user to selectively stress the system to its full capacity (bandwidth) for long duration. This means there should be no/few cycles where the system is idle. Read and write transactions can be interleaved to test the shared bidirectional data bus. The sequencing of transactions can be randomized or otherwise altered to determine sensitivity to a particular pattern of transactions—to, for example, avoid a test procedure where in which transaction A is always followed by transaction B. Address, data and write byte-enables can be randomized to test for signal integrity issues such as simultaneously switching outputs (SSO) and inter-symbol interference (ISI).

The DBIST 140 provides a flexible and robust approach to the testing of the memory interface 120. As discussed above, the testing is controlled by controller 200 in response to plurality of user test options. The user test options can include options that are used by controller 200 to control the generation of read and write commands 220 by transaction scheduler 202. For example, user test options can specify the degree of interleaving between read transactions and write transactions, and size indicators related to the size of read transaction bursts and write transaction bursts, etc. The user test options can further include options that are used by controller 200 to control the generation of transaction addresses 222. In particular, the transaction addresses can be generated based on either address patterns generated by address pattern generator 204 or random DRAM addresses generated by random number generator 206 and selected via selector 218. Further, the write data and byte enables 224 can be generated based on either fixed patterns generated by write data pattern generator 208 or random write data and/or byte enables generated by random number generator 206 and selected via selector 219. In addition, the user test options can specify other test parameters such as a test data selection that indicates the test data to be stored in the output register in response to a failure, a test duration selection that indicates a time duration of the testing of the memory interface 120 for example, from 1 millisecond to multiple days, and also a host interrupt selection having a value indicating to the controller 200 whether or not to generate a host interrupt in case of failure.

While shown as a separate block, error determination unit 228 can be incorporated into the operation of controller 200 or otherwise operate under the control of controller 200. When an error is detected, the failing address is passed to debug information storage unit 212 and along to output register 214 along with expected and incorrect data to assist with the debugging. Controller 200 also stores its own configuration to allow the host to repeatedly trigger the failure and potentially capture an illegal transaction on a logic analyzer/oscilloscope attached the failing system. This process helps in determining the root-cause of the failure and finding an appropriate fix.

As discussed above, DBIST 140 is highly configurable through the user controlled input register 216. To perform complete testing of the memory interface 120, the engine can be triggered using either default or user selected register settings. The user test options can be set up, for example, to maximize the activity (or minimize the idle cycles) on the interface by issuing a series of long and short bursts of interleaved write and read transactions. The sequencing of read/write commands 220 can be pseudo-randomized by the transaction scheduler 202 so that all possible combinations are tested. A combination of fixed and random transaction addresses 222, write data and byte-enable patterns 224 are generated by dedicated pattern generator blocks 204 and 208 and the random number generator. In case of a write transaction, the golden reference data is stored in the pattern storage 210 so that it can be used to verify subsequent read data 226. In case of a mismatch, the transaction address, reference data and/or read data 226 is stored in the debug information storage 212 so that it can be later retrieved to understand, to reconstruct and determine the root-cause and failure mechanism.

Once the DBIST 140 is triggered, no intervention from external host is required, i.e. the control logic has intelligence to manage itself. The DBIST 140 can be allowed to run for any variable duration of time ranging from 1 millisecond to several hours or even days including, for example system aging tests. The DBIST 140 allows system designers and OEMs to verify their PCB design and DRAM subsystem without waiting for the final application. To assist with the debugging, DBIST 140 saves the configuration of its own controller so that the failure can be repeatedly triggered, it stores the failing address along with expected and incorrect data, and optionally interrupts the host if a failure is detected DBIST 140 can be used in conjunction with SoC bring-up to perform silicon characterization with varying process, voltage and temperature (PVT). DBIST 140 can further be used in Customer PCB/system bring-up to verify customer designs without waiting for the final application, thus speeding-up the design schedule. The DBIST 140 operates in conjunction with automatic test equipment (ATE) to detect silicon defects with minimal tester time, thus reducing the production costs.

Figure 4:
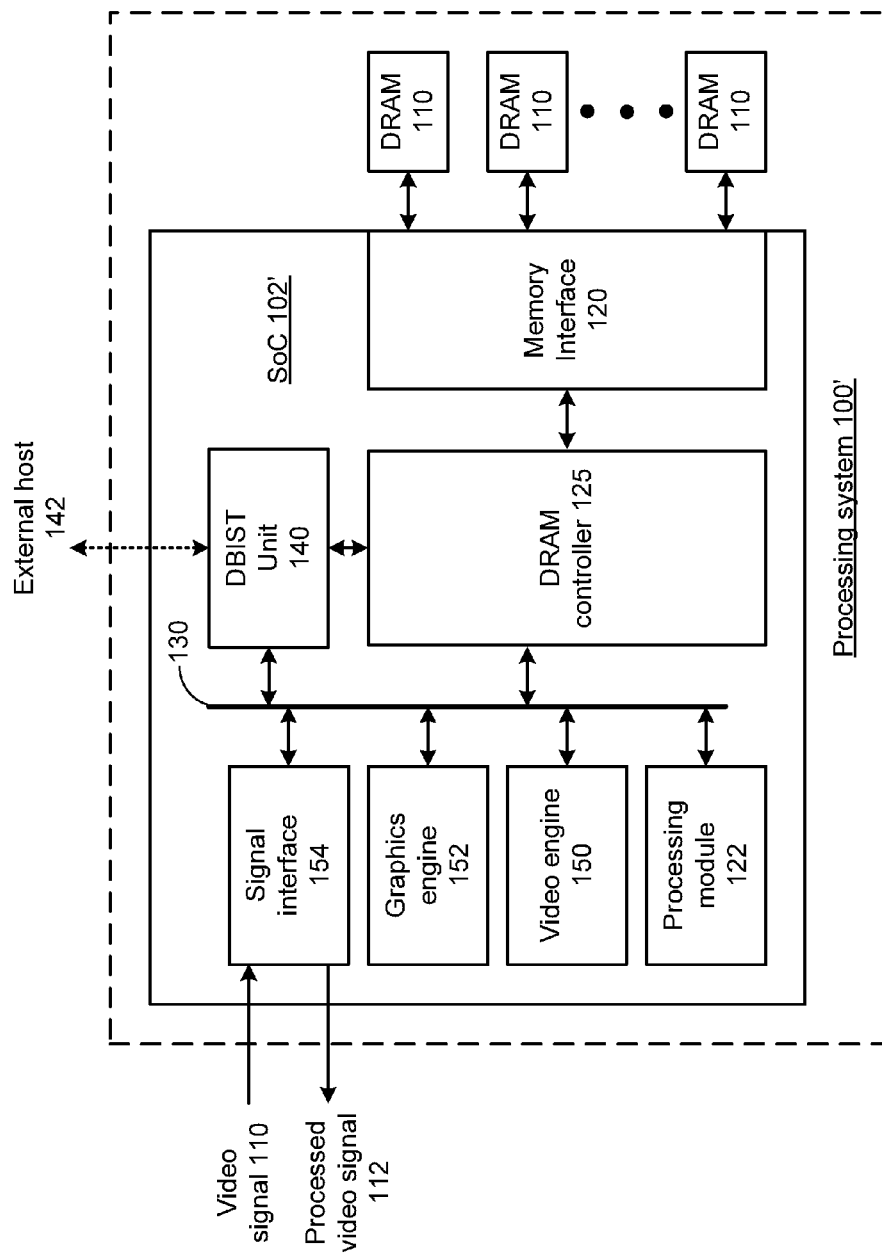
FIG. 4 presents a block diagram representation of a video processing system 100' in accordance with a further embodiment of the present invention.

FIG. 4 presents a block diagram representation of a video processing system 100' in accordance with a further embodiment of the present invention. In particular, video processing system 100' includes the elements of processing system 100 that are referred to by common reference numerals. The video processing system includes a SoC 102' having a video engine 150 and graphics engine 152 for implementing a video processing function. In one example, one or more of the DRAMs 110 can be used to implement frame buffer that is used to store all intermediate and final video data in conjunction with such processing. DBIST unit 140 operates as described in conjunction with FIGS. 2 and 3, yet in context of this alternative environment.

Signal interface 154 receives a video signal 110 and outputs a processed video signal 112 generated by processing of the video signal 110 via, for example, scrambling, descrambling, encoding, decoding, transcoding and/or other video processing. While referred to as video signals, video signal 110 and processed video signal 112 can each include an associated audio component. As used herein, transcoding can include transrating, transcrypting, and/or transcaling the video signal 110 to generate processed video signal 112 in addition to transcoding the video signal 110 from one encoded video format into another encoded video format (MPEG1,2,4 to H.264, etc.) to form processed video signal 112. Transcoding can further include transcoding the audio portion of video signal 110 to a different sample rate, encoding standard or other digital format, stereo to mono, etc.

Signal interface 154 can receive video signal 110 via a wireless receiver via a WLAN, Bluetooth connection, infrared connection, wireless telephony receiver or other wireless data connection, or a wired modem or other network adaptors that uses a wired receiver or other device to receive the decrypted signal from a LAN, the Internet, cable network, telephone network or other network or from another device. Signal interface 154 can also receive video signal 110 in accordance with an Ethernet protocol, a memory card protocol, USB protocol, Firewire (IEEE 1394) protocol, SCSI protocol, PCMCIA protocol, or other protocol either standard or proprietary.

Video signal 110 and processed video signal 112 can each be analog or digital video signals in any of a number of video formats with or without an associated audio component. Such analog video signal can include formats such as National Television Systems Committee (NTSC), Phase Alternating Line (PAL) or Sequentiel Couleur Avec Memoire (SECAM). Such digital video formats can include formats such as H.264, MPEG-4 Part 10 Advanced Video Coding (AVC) or other digital format such as a Moving Picture Experts Group (MPEG) format (such as MPEG1, MPEG2 or MPEG4), Quicktime format, Real Media format, Windows Media Video (WMV), Audio Video Interleave (AVI), high definition media interface (HDMI) or another digital video format, either standard or proprietary.

Video signal 110 and/or processed video signal 112 can be interfaced in association with a set-top box, television receiver, personal computer, cable television receiver, satellite broadcast receiver, broadband modem, 3G transceiver, a broadcast satellite system, internet protocol (IP) TV system, the Internet, a digital video disc player, a digital video recorder, or other video device. In an embodiment of the present invention, the video signals 110 and or 112 can include a broadcast video signal, such as a television signal, high definition television signal, enhanced high definition television signal or other broadcast video signal that has been transmitted over a wireless medium, either directly or through one or more satellites or other relay stations or through a cable network, optical network or other transmission network. In addition, the video signal 110 and/or processed video signal 112 can be generated from a stored video file, played back from a recording medium such as a magnetic tape, magnetic disk or optical disk, and can include a streaming video signal that is transmitted over a public or private network such as a local area network, wide area network, metropolitan area network or the Internet. In operation, video processing module 100' is coupled to the receiving module 100 to encode, transrate, transcrypt, transcale and/or otherwise transcode one or more of the video signals 110 to form processed video signal 112.

Figure 5:
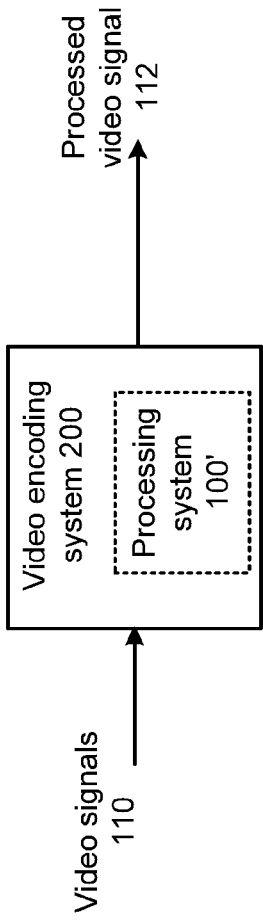
FIG. 5 presents a block diagram representation of a video encoding system 200 in accordance with an embodiment of the present invention.

FIG. 5 presents a block diagram representation of a video encoding system 200 in accordance with an embodiment of the present invention. In particular, video encoding system 200, such as video processing system 100', operates in accordance with many of the functions and features of the H.264, MPEG-4 Part 10 Advanced Video Coding (AVC), or other digital format such as a Moving Picture Experts Group (MPEG) format (such as MPEG1, MPEG2 or MPEG4), VC-1 (SMPTE standard 421M), Quicktime format, Real Media format, Windows Media Video (WMV), Audio Video Interleave (AVI), high definition media interface (HDMI) or another digital video format, either standard or proprietary or other video format, to encode video input signals 110 to form processed video signal 112.

Figure 6:
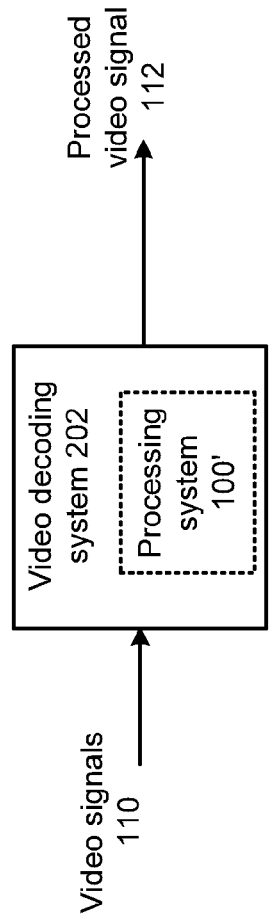
FIG. 6 presents a block diagram representation of a video decoding system 202 in accordance with an embodiment of the present invention.

FIG. 6 presents a block diagram representation of a video decoding system 202 in accordance with an embodiment of the present invention. In particular, video decoding system 202, such as video processing system 100', operates in accordance with many of the functions and features of the H.264, MPEG-4 Part 10 Advanced Video Coding (AVC), or other digital format such as a Moving Picture Experts Group (MPEG) format (such as MPEG1, MPEG2 or MPEG4), VC-1 (SMPTE standard 421M), Quicktime format, Real Media format, Windows Media Video (WMV), Audio Video Interleave (AVI), high definition media interface (HDMI) or another digital video format, either standard or proprietary or other video format, to decode video input signals 110 to form processed video signal 112.

Figure 7:
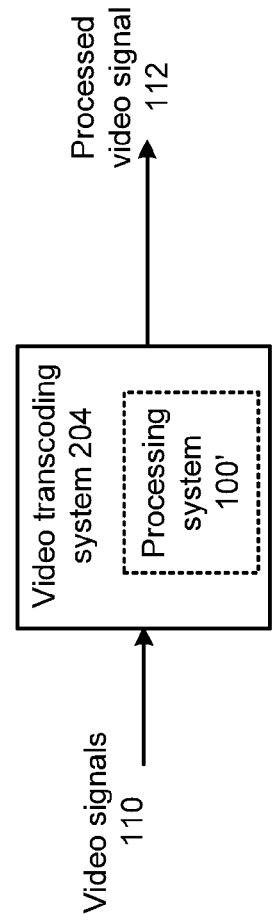
FIG. 7 presents a block diagram representation of a video transcoding system 204 in accordance with an embodiment of the present invention.

FIG. 7 presents a block diagram representation of a video transcoding system 204 in accordance with an embodiment of the present invention. In particular, video transcoding system 204, such as video processing system 100', operates in accordance with many of the functions and features of the H.264, MPEG-4 Part 10 Advanced Video Coding (AVC), or other digital format such as a Moving Picture Experts Group (MPEG) format (such as MPEG1, MPEG2 or MPEG4), VC-1 (SMPTE standard 421M), Quicktime format, Real Media format, Windows Media Video (WMV), Audio Video Interleave (AVI), high definition media interface (HDMI) or another digital video format, either standard or proprietary or other video format, to transcode video input signals 110 to form processed video signal 112.

Figure 8:
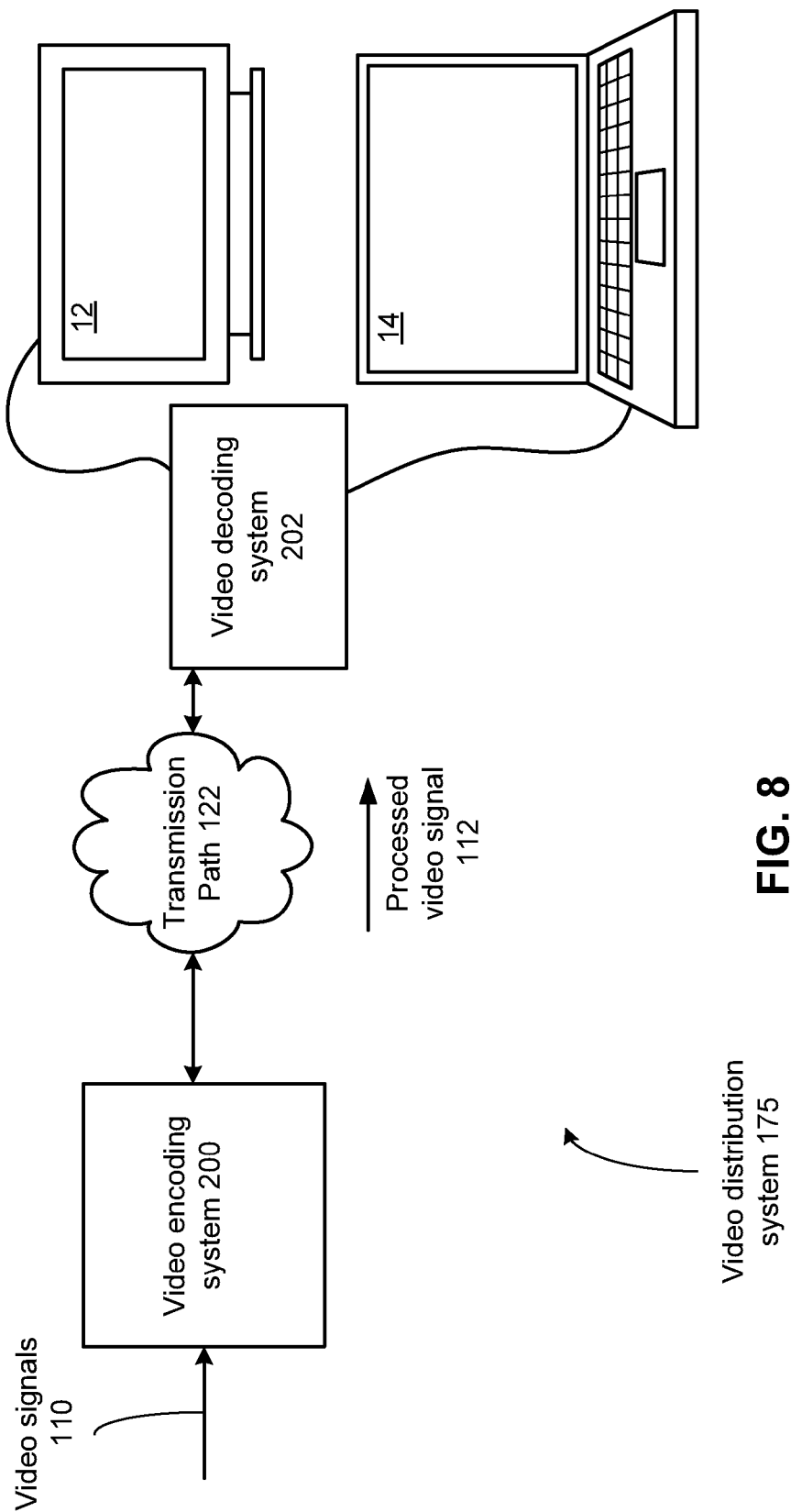
FIG. 8 presents a block diagram representation of a video distribution system 175 in accordance with an embodiment of the present invention.

FIG. 8 presents a block diagram representation of a video distribution system 175 in accordance with an embodiment of the present invention. In particular, processed video signal 112 is transmitted via a transmission path 122 to a video decoder 202. Video decoder 202, in turn can operate to decode the processed video signal 112 for display on a display device such as television 10, computer 20 or other display device.

The transmission path 122 can include a wireless path that operates in accordance with a wireless local area network protocol such as an 802.11 protocol, a WIMAX protocol, a Bluetooth protocol, etc. Further, the transmission path can include a wired path that operates in accordance with a wired protocol such as a USB protocol, high-definition multimedia interface (HDMI) protocol an Ethernet protocol or other high speed protocol.

Figure 9:
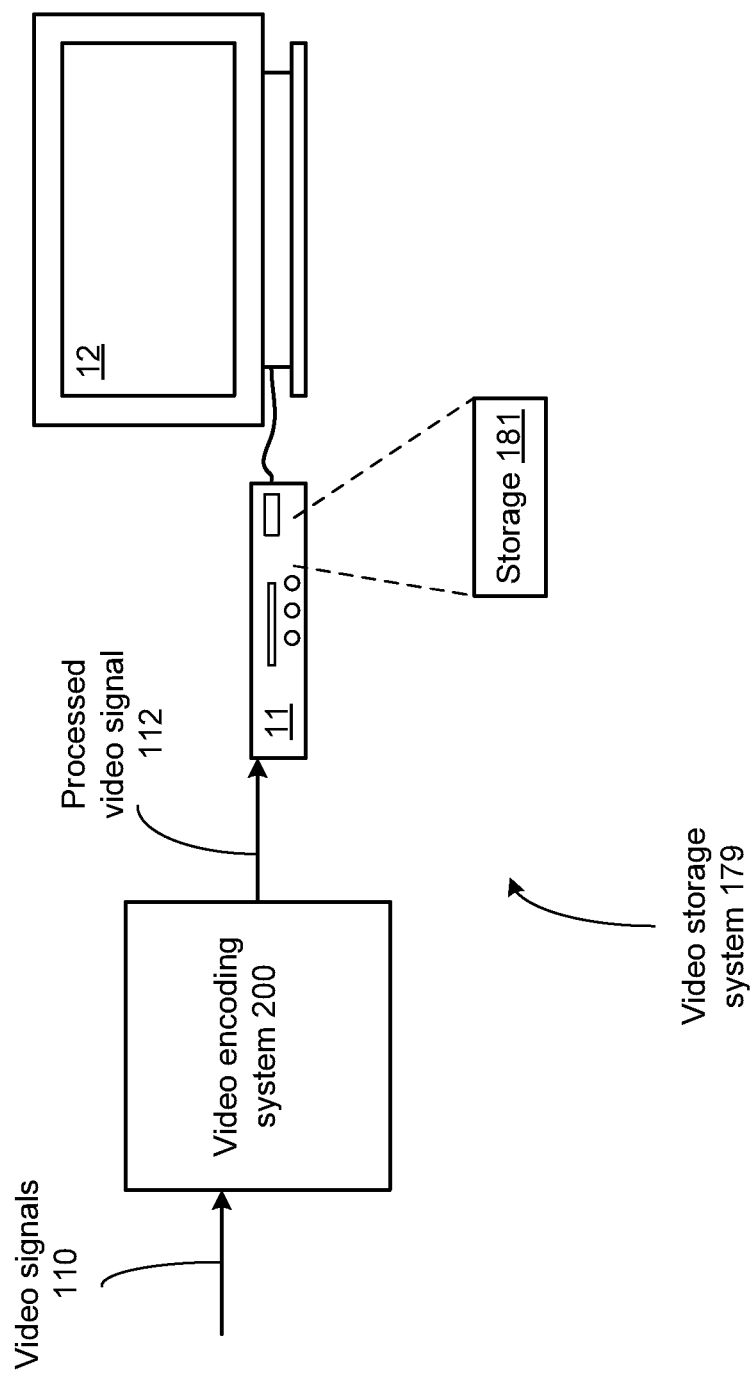
FIG. 9 presents a block diagram representation of a video storage system 179 in accordance with an embodiment of the present invention.

FIG. 9 presents a block diagram representation of a video storage system 179 in accordance with an embodiment of the present invention. In particular, device 11 is a set top box with built-in digital video recorder functionality, a stand alone digital video recorder, a DVD recorder/player or other device that stores the processed video signal 112 in storage 181 for display on video display device such as television 12. Storage 181 can include a hard disk drive optical disk drive or other disk drive, read-only memory, random access memory, volatile memory, non-volatile memory, static memory, dynamic memory, flash memory, cache memory, and/or any device that stores digital information. Storage 181 can be integrated in the device 11 or coupled to the device 11 via a network, wireline coupling or other connection.

While video encoder 200 is shown as a separate device, it can further be incorporated into device 11. While these particular devices are illustrated, video storage system 179 can include a hard drive, flash memory device, computer, DVD burner, or any other device that is capable of generating, storing, decoding and/or displaying a video stream 220 in accordance with the methods and systems described in conjunction with the features and functions of the present invention as described herein.

FIG. 10 presents a flowchart representation of a method in accordance with an embodiment of the present invention. In particular a method is presented for use in conjunction with one or more functions and features described in conjunction with FIGS. 1-8. In step 400, an integrated circuit is interfaced with at least one dynamic random access memory (DRAM) via a memory interface. In step 402, a plurality of user test options are received. In step 404, the memory interface is tested in accordance with the plurality of user test options. In step 406, test data generated as a result of the testing of the memory interface is stored.

In an embodiment of the present invention, the testing of the memory interface includes a plurality of read transactions and a plurality of write transactions and the plurality of user test options can include a degree of interleaving between the plurality of read transactions and the plurality of write transactions. The testing of the memory interface can include a plurality of read transaction bursts and a plurality of write transaction bursts and the plurality of user test options can include a size indicator related to at least one of: a size of the plurality of read transaction bursts; and a size of the plurality of write transaction bursts. The plurality of user test options can include an address generation selection, and step 404 can include: generating a sequence of DRAM addresses; generating a plurality of random DRAM addresses; and selecting between the sequence of DRAM addresses and the plurality of random DRAM addresses, based on the address generation selection.

The plurality of user test options can include a byte-enable generation selection, and step 404 can includes: generating a pattern of byte-enables; generating a plurality of random byte-enables; and selecting between the a pattern of byte-enables and the plurality of random byte-enables, based on the byte-enable generation selection. The plurality of user test options can include a write data generation selection, and step 404 can include: generating a pattern of write data; generating a plurality of random data; and selecting between the a pattern of write data and the plurality of random write data, based on the write data generation selection.

The plurality of user test options can also include a test data selection that indicates the test data to be stored in the output register in response to a failure, a test duration selection that indicates a time duration of the testing of the memory interface and/or a host interrupt selection having a first value indicating interrupt generation in case of failure and a second value indicating no host interrupt generation in case of failure. Step 404 can include selectively generating a host interrupt in case of failure in response to the host interrupt selection.

While particular combinations of various functions and features of the present invention have been expressly described herein, other combinations of these features and functions are possible that are not limited by the particular examples disclosed herein are expressly incorporated within the scope of the present invention.

As one of ordinary skill in the art will further appreciate, the term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "coupled".

As the term module is used in the description of the various embodiments of the present invention, a module includes a functional block that is implemented in hardware, software, and/or firmware that performs one or more functions such as the processing of an input signal to produce an output signal. As used herein, a module may contain submodules that themselves are modules.

Thus, there has been described herein an apparatus and method, as well as several embodiments including a preferred embodiment, for implementing a processing system and video processing system along with DRAM built-in self test unit for use in testing DRAM and memory interfaces and likewise can be used in testing other interfaces and other memories. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. An integrated circuit comprising:
   a memory interface for interfacing the integrated circuit with at least one dynamic random access memory (DRAM);
   a processing module for executing at least one application;
   a DRAM controller, coupled to the processing module and the memory interface, for controlling access to the at least one dynamic random access memory in conjunction with the application; and
   a DRAM built-in self test (DBIST) unit, coupled to the DRAM controller, for testing the memory interface, the DBIST unit including:
      a input register for receiving a plurality of user test options;
      a controller, coupled to the input register, for controlling the testing of the memory interface in accordance with the plurality of user test options; and
      an output register, coupled to the controller, for storing test data generated as a result of the testing of the memory interface.

2. The integrated circuit of claim 1 wherein the testing of the memory interface includes a plurality of read transactions and a plurality of write transactions; and
   wherein the plurality of user test options include a degree of interleaving between the plurality of read transactions and the plurality of write transactions.

3. The integrated circuit of claim 1 wherein the testing of the memory interface includes a plurality of read transaction bursts and a plurality of write transaction bursts; and
   wherein the plurality of user test options include a size indicator related to at least one of: a size of the plurality of read transaction bursts; and a size of the plurality of write transaction bursts.

4. The integrated circuit of claim 1 wherein the plurality of user test options include an address generation selection, and wherein the DBIST unit further includes:
   an address pattern generator, coupled to the controller, for generating a sequence of DRAM addresses;
   a random number generator, coupled to the controller, for generating a plurality of random DRAM addresses; and
   a selector, coupled to the address pattern generator and the random number generator, that selects between the sequence of DRAM addresses and the plurality of random DRAM addresses, based on the address generation selection.

5. The integrated circuit of claim 1 wherein the plurality of user test options include a byte-enable generation selection, and wherein the DBIST unit further includes:
   a write data pattern generator, coupled to the controller, for generating a pattern of byte-enables;
   a random number generator, coupled to the controller, for generating a plurality of random byte-enables; and
   a selector, coupled to the write data pattern generator and the random number generator, that selects between the a pattern of byte-enables and the plurality of random byte-enables, based on the byte-enable generation selection.

6. The integrated circuit of claim 1 wherein the plurality of user test options include a write data generation selection, and wherein the DBIST unit further includes:
   an write data pattern generator, coupled to the controller, for generating a pattern of write data;
   a random number generator, coupled to the controller, for generating a plurality of random data; and
   a selector, coupled to the write data pattern generator and the random number generator, that selects between the a pattern of write data and the plurality of random write data, based on the write data generation selection.

7. The integrated circuit of claim 1 wherein the plurality of user test options include a test data selection that indicates the test data to be stored in the output register in response to a failure.

8. The integrated circuit of claim 1 wherein the plurality of user test options include a test duration selection that indicates a time duration of the testing of the memory interface.

9. The integrated circuit of claim 1 wherein the plurality of user test options include a host interrupt selection having a first value indicating interrupt generation in case of failure and a second value indicating no host interrupt generation in case of failure, and wherein the controller selectively generates a host interrupt in case of failure in response to the host interrupt selection.

10. A method comprising:
    interfacing an integrated circuit with at least one dynamic random access memory (DRAM) via a memory interface;
    receiving a plurality of user test options;
    testing the memory interface in accordance with the plurality of user test options; and
    storing test data generated as a result of the testing of the memory interface.

11. The method of claim 10 wherein the testing of the memory interface includes a plurality of read transactions and a plurality of write transactions; and wherein the plurality of user test options include a degree of interleaving between the plurality of read transactions and the plurality of write transactions.

12. The method of claim 10 wherein the testing of the memory interface includes a plurality of read transaction bursts and a plurality of write transaction bursts; and wherein the plurality of user test options include a size indicator related to at least one of: a size of the plurality of read transaction bursts; and a size of the plurality of write transaction bursts.

13. The method of claim 10 wherein the plurality of user test options include an address generation selection, and wherein controlling the testing of the memory interface includes:

generating a sequence of DRAM addresses;
generating a plurality of random DRAM addresses; and
selecting between the sequence of DRAM addresses and the plurality of random DRAM addresses, based on the address generation selection.

14. The method of claim 10 wherein the plurality of user test options include a byte-enable generation selection, and wherein controlling the testing of the memory interface includes:

generating a pattern of byte-enables;
generating a plurality of random byte-enables; and
selecting between the a pattern of byte-enables and the plurality of random byte-enables, based on the byte-enable generation selection.

15. The method of claim 10 wherein the plurality of user test options include a write data generation selection, and wherein controlling the testing of the memory interface includes:

generating a pattern of write data;
generating a plurality of random data; and
selecting between the a pattern of write data and the plurality of random write data, based on the write data generation selection.

16. The method of claim 10 wherein the plurality of user test options include a test data selection that indicates the test data to be stored in the output register in response to a failure.

17. The method of claim 10 wherein the plurality of user test options include a test duration selection that indicates a time duration of the testing of the memory interface.

18. The method of claim 10 wherein the plurality of user test options include a host interrupt selection having a first value indicating interrupt generation in case of failure and a second value indicating no host interrupt generation in case of failure, and wherein controlling the testing of the memory interface includes selectively generating a host interrupt in case of failure in response to the host interrupt selection.

* * * * *